United States Patent
Yamasaki

(10) Patent No.: US 9,842,849 B1
(45) Date of Patent: Dec. 12, 2017

(54) SEMICONDUCTOR MEMORY DEVICE AND METHOD FOR MANUFACTURING THE SAME

(71) Applicant: Toshiba Memory Corporation, Minato-ku (JP)

(72) Inventor: Hiroyuki Yamasaki, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/463,675

(22) Filed: Mar. 20, 2017

Related U.S. Application Data

(60) Provisional application No. 62/395,397, filed on Sep. 16, 2016.

(51) Int. Cl.
| | |
|---|---|
| H01L 29/792 | (2006.01) |
| H01L 27/11568 | (2017.01) |
| H01L 27/11582 | (2017.01) |
| H01L 21/02 | (2006.01) |
| H01L 27/1158 | (2017.01) |
| H01L 21/20 | (2006.01) |

(52) U.S. Cl.
CPC .. *H01L 27/11568* (2013.01); *H01L 21/02293* (2013.01); *H01L 21/02634* (2013.01); *H01L 21/2018* (2013.01); *H01L 21/2022* (2013.01); *H01L 27/1158* (2013.01); *H01L 27/11582* (2013.01)

(58) Field of Classification Search
CPC .......... H10L 27/11568; H01L 27/1158; H01L 21/02293; H01L 21/02634; H01L 21/2018; H01L 21/2022
See application file for complete search history.

(56) References Cited

U.S. PATENT DOCUMENTS

| | | | | |
|---|---|---|---|---|
| 9,343,475 | B2 * | 5/2016 | Jang | ................. H01L 27/11582 |
| 2014/0035026 | A1 | 2/2014 | Jang et al. | |
| 2014/0070302 | A1 | 3/2014 | Yoo et al. | |
| 2015/0214242 | A1 | 7/2015 | Lee | |
| 2016/0276365 | A1 * | 9/2016 | Choi | ................. H01L 27/11582 |
| 2017/0103997 | A1 * | 4/2017 | Lee | ..................... H01L 21/0243 |

FOREIGN PATENT DOCUMENTS

| | | |
|---|---|---|
| JP | 2014-33201 | 2/2014 |
| JP | 2014-57067 | 3/2014 |
| JP | 2015-142133 | 8/2015 |

\* cited by examiner

*Primary Examiner* — David Vu
*Assistant Examiner* — Brandon Fox
(74) *Attorney, Agent, or Firm* — Oblon, McClelland, Maier & Neustadt, L.L.P.

(57) ABSTRACT

According to one embodiment, a semiconductor memory device includes a semiconductor substrate, a stacked body, a semiconductor member, a semiconductor portion, a first insulating film, and a charge storage film. The semiconductor member includes a first portion and a second portion, the first portion contacting with the semiconductor substrate, the second portion being provided on the first portion, contacting with the first portion, and having a second width smaller than a first width of the first portion in a first direction crossing a stacking direction. The first insulating film is provided on a side surface of the second portion. The charge storage film is provided on a side surface of the semiconductor portion, extends in the stacking direction, and includes a first portion located on an upper surface of the second portion of the semiconductor member.

19 Claims, 14 Drawing Sheets

US 9,842,849 B1

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/395,397 filed on Sep. 16, 2016; the entire contents of which are incorporated herein by reference.

FIELD

Embodiments described herein relate generally to a semiconductor memory device and a method for manufacturing the same.

BACKGROUND

Recently, a stacked-type semiconductor memory device in which memory cells are three-dimensionally integrated has been proposed. In such a stacked-type semiconductor memory device, a stacked body in which an insulating layer and an electrode layer are alternately stacked on a semiconductor substrate is provided, and a channel piercing the stacked body is provided. Then, a memory cell is formed at a crossing portion between the electrode layer and the channel. For such a semiconductor memory device, an object is to maintain stability of the operation.

DETAILED DESCRIPTION

Figure 1:
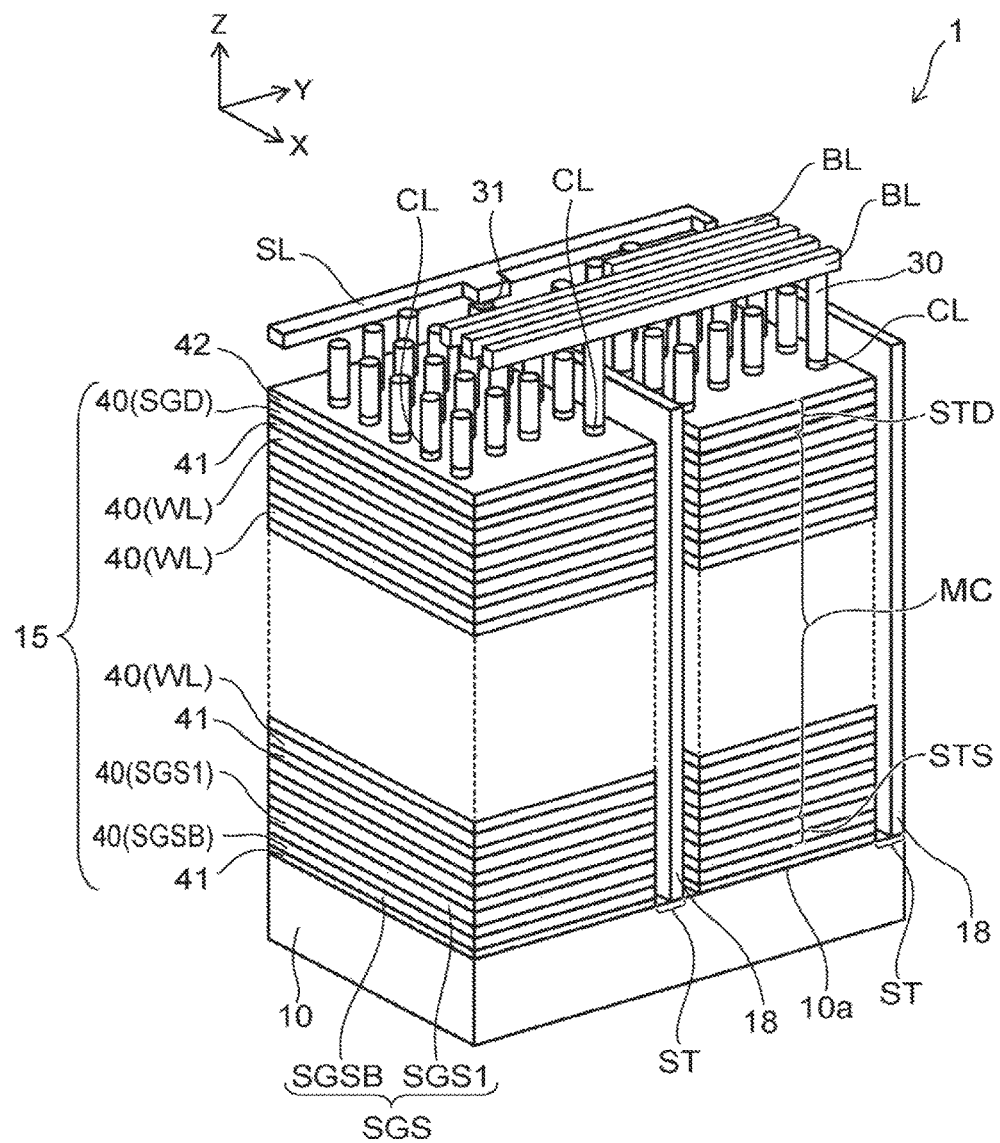
FIG. 1 is a perspective view showing a semiconductor memory device according to a first embodiment.

According to one embodiment, a semiconductor memory device includes a semiconductor substrate, a stacked body, a semiconductor member, a semiconductor portion, a first insulating film, and a charge storage film. The stacked body is provided on the semiconductor substrate and includes a plurality of electrode layers separately stacked each other. The semiconductor member is provided in the semiconductor substrate and in the stacked body, and extends in a stacking direction of the plurality of electrode layers. The semiconductor member includes a first portion and a second portion, the first portion being in contact with the semiconductor substrate, the second portion being provided on the first portion, being in contact with the first portion, and having a second width smaller than a first width of the first portion in a first direction crossing the stacking direction. The semiconductor portion is provided in the stacked body, extends in the stacking direction, and is in contact with an upper surface of the second portion. The first insulating film is provided on a side surface of the second portion. The charge storage film is provided on a side surface of the semiconductor portion, extends in the stacking direction, and includes a first portion located on an upper surface of the second portion of the semiconductor member.

Hereinafter, embodiments will be described with reference to the drawings. Incidentally, in the respective drawings, the same elements are denoted by the same reference numerals.

First Embodiment

FIG. 1 is a perspective view showing a memory cell array of a semiconductor memory device 1.

As shown in FIG. 1, in the semiconductor memory device 1, a substrate 10 is provided. The substrate 10 is a semiconductor substrate, and contains silicon (Si) such as single crystal silicon.

Incidentally, in the specification, two directions parallel to an upper surface 10a of the substrate 10 and also orthogonal to each other are referred to as X-direction and Y-direction, and a direction orthogonal to both X-direction and Y-direction is referred to as Z-direction.

The semiconductor memory device 1 includes a stacked body 15 and a plurality of columnar portions CL. In the semiconductor memory device 1, a plurality of slits ST is formed. The stacked body 15 includes a source-side selection gate SGS, a drain-side selection gate SGD, a plurality of word lines WL, and a plurality of insulating layers 41. A stacking direction of the stacked body 15 corresponds to the Z-direction.

The source-side selection gate SGS includes a lower layer source-side selection gate SGSB and an upper layer source-side selection gate SGS1. The lower layer source-side selection gate SGSB is provided on the substrate 10 through the insulating layer 41, and the upper layer source-side selection gate SGS1 is provided on the lower layer source-side selection gate SGSB through the insulating layer 41. Incidentally, in an example shown in FIG. 1, the source-side selection gate SGS is composed of two layers, however, the stacking number of the source-side selection gate SGS is arbitrary.

The drain-side selection gate SGD is provided in a highest layer of the stacked body 15. The plurality of word lines WL is provided between the source-side selection gate SGS and the drain-side selection gate SGD. The stacking number of each of the drain-side selection gate SGD and the word line WL is arbitrary. The source-side selection gate SGS, the plurality of word lines WL, and the drain-side selection gate SGD are electrode layers 40.

The insulating layer 41 is provided between the electrode layers 40. The insulating layer 41 contains, for example, silicon oxide (SiO). On the stacked body 15, an insulating layer 42 is provided. The insulating layer 42 contains, for example, silicon oxide.

A plurality of columnar portions CL is provided in the stacked body 15. The columnar portions CL extend in the Z-direction in the stacked body 15. The columnar portions CL are formed, for example, in a circular columnar shape or an elliptical columnar shape. The columnar portions CL are disposed in a staggered arrangement in an X-Y plane.

On an upper side of the columnar portions CL, a plurality of bit lines BL extending in the Y-direction is provided. An upper end of the columnar portion CL is connected to one bit line BL through a contact portion 30. The contact portion 30 is formed of a conductor such as a metal.

A plurality of slits ST is formed in the stacked body 15. The slits ST extend in the Z-direction and X-direction in the stacked body 15. The slits ST separate the stacked body 15 into a plurality of regions in the Y-direction. Each region separated by the slits ST is called "block". The columnar portion CL selected one by one from each block is electrically connected to one bit line BL.

In the slit ST, an interconnect portion 18 is provided. The interconnect portion 18 extends in the Z-direction and X-direction. A lower end of the interconnect portion 18 is in contact with the substrate 10. The interconnect portion 18 contains, for example, a metal such as tungsten (W). Further, an insulating film (not shown) is provided in the slit ST and on a side wall of the interconnect portion 18. The insulating film electrically insulates the interconnect portion 18 from the electrode layers 40 of the stacked body 15.

On an upper side of the interconnect portion 18, a source line SL extending in the Y-direction is provided. An upper end of the interconnect portion 18 is connected to the source line SL through a contact portion 31. The contact portion 31 is formed of a conductor such as a metal.

At a crossing portion between the upper layer source-side selection gate SGS1 and the columnar portion CL, a source-side selection transistor STS is formed, and at a crossing portion between the drain-side selection gate SGD and the columnar portion CL, a drain-side selection transistor STD is formed. Further, at a crossing portion between the word line WL and the columnar portion CL, a memory cell MC is formed.

In the source-side selection transistor STS, the upper layer source-side selection gate SGS1 and the lower layer source-side selection gate SGSB each function as a gate, and in the drain-side selection transistor STD, the drain-side selection gate SGD functions as a gate. Incidentally, in the source-side selection gate SGS, the source-side selection gate which functions as a gate may be formed of a plurality of layers, and the source-side selection gate in a dummy portion may be formed of a plurality of layers. Further, a dummy portion may not be provided in the source-side selection gate SGS.

In the memory cell MC, the word line WL functions as a gate, and a part of the columnar portion CL functions as a channel. A plurality of memory cells MC is connected in series through the columnar portion CL between the source-side selection transistor STS and the drain-side selection transistor STD.

Figure 2:
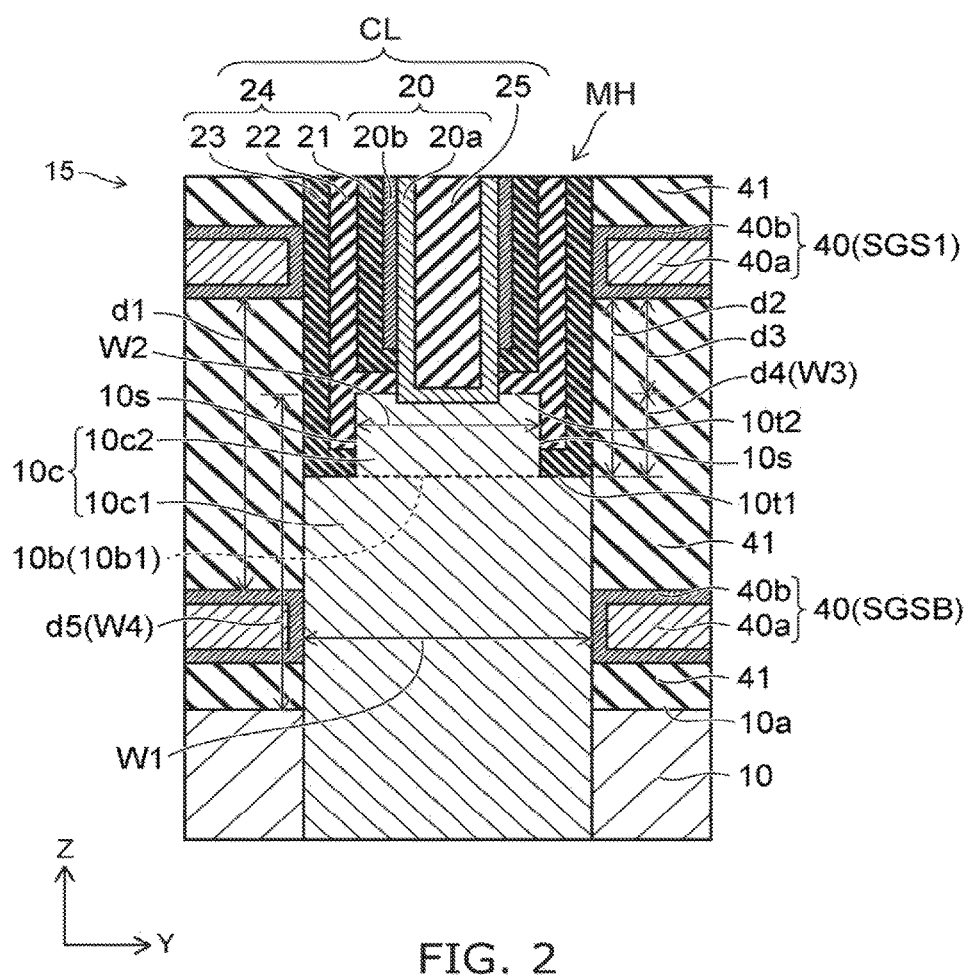
FIG. 2 is a cross-sectional view showing a part of the semiconductor memory device according to the first embodiment.

FIG. 2 shows a lower part of the stacked body 15 in the vicinity of the columnar portion CL in an enlarged manner.

As shown in FIG. 2, a memory hole MH is formed in the stacked body 15. The memory hole MH extends in the Z-direction in the substrate 10 and the stacked body 15.

The electrode layer 40 of the stacked body 15 includes a main body portion 40a and a peripheral portion 40b. The main body portion 40a contains, for example, a metal such as tungsten (W).

The peripheral portion 40b is provided on a surface of the main body portion 40a. The peripheral portion 40b contains, for example, titanium nitride (TiN). The peripheral portion 40b is, for example, a barrier metal layer. The peripheral portion 40b may not be provided in the electrode layer 40.

The columnar portion CL is provided in the memory hole MH. The columnar portion CL includes a core portion 25, a channel 20, and a memory film 24.

The core portion 25 contains, for example, silicon oxide. A shape of the core portion 25 is, for example, a circular columnar shape. On an upper end of the core portion 25, a contact plug (not shown) formed of silicon or the like is provided. A periphery of the contact plug is surrounded by the channel 20, and an upper end thereof is connected to the contact portion 30.

The channel 20 is provided around the core portion 25. The channel 20 is a semiconductor portion and includes a body 20a and a cover layer 20b. A shape of the body 20a is, for example, a bottomed cylindrical shape. The cover layer 20b is provided around the body 20a. A shape of the cover layer 20b is, for example, a cylindrical shape.

The body 20a and the cover layer 20b contain silicon. For example, the body 20a and the cover layer 20b contain amorphous silicon. For example, the body 20a and the cover layer 20b contain polysilicon obtained by crystallization of amorphous silicon.

The memory film 24 is provided around the channel 20. The memory film 24 includes a tunnel insulating film 21, a charge storage film 22, and a block insulating film 23.

The tunnel insulating film 21 is provided around the channel 20. The tunnel insulating film 21 contains, for example, silicon oxide. A shape of the tunnel insulating film 21 is, for example, a cylindrical shape.

The charge storage film 22 is provided around the tunnel insulating film 21. The charge storage film 22 contains, for example, silicon nitride (SiN). A shape of the charge storage film 22 is, for example, a cylindrical shape. At a crossing portion between the channel 20 and the word line WL, a memory cell MC including the charge storage film 22 is formed.

The tunnel insulating film 21 is a potential barrier between the charge storage film 22 and the channel 20. In the tunnel insulating film 21, when a charge moves from the channel 20 to the charge storage film 22 (writing operation), and when a charge moves from the charge storage film 22 to the channel 20 (erasing operation), the charge tunnels.

The charge storage film 22 has a trap site which traps a charge in the film. A threshold of the memory cell MC changes depending on the presence or absence of a charge trapped by the trap site, and the amount of a trapped charge. Thereby, the memory cell MC holds information.

The block insulating film 23 is provided around the charge storage film 22. For example, the block insulating film 23 is a silicon oxide film containing silicon oxide or an aluminum oxide film containing aluminum oxide (A1O). The block insulating film 23 may be a stacked film of a silicon oxide film and an aluminum oxide film. The block insulating film 23 protects, for example, the charge storage film 22 from etching when forming the electrode layer 40.

On an outside of the block insulating film 23, the peripheral portion 40b of the upper layer source-side selection gate SGS1 is provided. The peripheral portion 40b of the upper layer source-side selection gate SGS1 is provided between the main body portion 40a of the upper layer source-side selection gate SGS1 and the block insulating film 23.

A connection member 10c (semiconductor member) is provided over an inner portion of the stacked body 15 from an inner portion of the substrate 10 in the memory hole MH. The connection member 10c (second portion 10c2) is in contact with the body 20a of the channel 20. According to this, the channel 20 is electrically connected to the substrate 10.

The connection member 10c is a member formed by epitaxially growing silicon. The connection member 10c includes a first portion 10c1 and a second portion 10c2. The first portion 10c1 is a silicon member obtained by epitaxial growth using the substrate 10 as a starting point. Therefore, a crystal structure of the substrate 10 and a crystal structure of the first portion 10c1 are continuous with each other.

The second portion 10c2 is a silicon member obtained by epitaxial growth using the first portion 10c1 as a starting point. Therefore, a crystal structure of the first portion 10c1 and a crystal structure of the second portion 10c2 are continuous with each other. As shown by a dashed line in FIG. 2, for example, a boundary surface 10b is formed in the connection member 10c in some cases. In a case where the boundary surface 10b is formed, the boundary surface 10b corresponds to a lower surface 10b1 of the second portion 10c2.

A shape of the first portion 10c1 is, for example, a circular columnar shape. A lower part of the first portion 10c1 is located in the substrate 10, and an upper part of the first portion 10c1 is located in the stacked body 15. In the Z-direction, an upper surface 10t1 of the first portion 10c1 is located between the lower layer source-side selection gate SGSB and the upper layer source-side selection gate SGS1. On the upper surface 10t1, the block insulating film 23 and the second portion 10c2 are provided, and for example, the upper surface 10t1 and the block insulating film 23 are in contact with each other.

On an outside of the first portion 10c1, the peripheral portion 40b of the lower layer source-side selection gate SGSB is provided. The peripheral portion 40b of the lower layer source-side selection gate SGSB is provided between the main body portion 40a of the lower layer source-side selection gate SGSB and the first portion 10c1.

A shape of the second portion 10c2 is, for example, a circular columnar shape. The second portion 10c2 is located in the stacked body 15. In the Z-direction, an upper surface 10t2 (an upper surface of the connection member 10c) of the second portion 10c2 is located between the lower layer source-side selection gate SGSB and the upper layer source-side selection gate SGS1. On the upper surface 10t2, the charge storage film 22 and the body 20a of the channel 20 are provided. For example, the upper surface 10t2 and the charge storage film 22 are in contact with each other. In the example shown in FIG. 2, on the upper surface 10t2, a height of the surface where the charge storage film 22 is provided is higher than a height of the surface where the body 20a is provided, but may be the same.

On a side surface 10s of the second portion 10c2, the charge storage film 22 and the block insulating film 23 are provided. For example, the side surface 10s is in contact with the charge storage film 22 and the block insulating film 23.

A width W1 of the first portion 10c1 is larger than a width W2 of the second portion 10c2. In the example shown in FIG. 2, the width W1 and the width W2 each correspond to a width in the Y-direction. Here, in a case where the first portion 10c1 has a portion in which a width is different in the Z-direction, the width W1 corresponds to an average width of a plurality of widths, and in a case where the second portion 10c2 has a portion in which the width W2 is different in the Z-direction, the width W2 corresponds to an average width of a plurality of widths.

Hereinafter, a distance between elements will be described.

A distance d1 in the Z-direction between the peripheral portion 40b of the upper layer source-side selection gate SGS1 and the peripheral portion 40b of the lower layer source-side selection gate SGSB is, for example, 100 nm or more and 150 nm or less. The distance d1 corresponds to a width of the insulating layer 41 provided between the upper layer source-side selection gate SGS1 and the lower layer source-side selection gate SGSB.

A distance d2 in the Z-direction between the peripheral portion 40b of the upper layer source-side selection gate SGS1 and the upper surface 10t1 of the first portion 10c1 of the connection member 10c is, for example, 55 nm or more.

A distance d3 in the Z-direction between the peripheral portion 40b of the upper layer source-side selection gate SGS1 and the upper surface 10t2 of the second portion 10c2 of the connection member 10c is, for example, 35 nm or less. For example, the distance d3 is not more than the width in the Z-direction of the upper layer source-side selection gate SGS1. For example, the distance d3 is not more than the width in the Z-direction of the lower layer source-side selection gate SGSB. For example, the distance d3 is not more than the width in the Z-direction of the word line WL. For example, the distance d3 is not more than the width in the Z-direction of the drain-side selection gate SGD.

A distance d4 in the Z-direction between the upper surface 10t1 of the first portion 10c1 of the connection member 10c and the upper surface 10t2 of the second portion 10c2 of the connection member 10c is, for example, 20 nm or more. The distance d4 corresponds to a width W3 of the second portion 10c2 in the Z-direction.

A distance d5 in the Z-direction between the upper surface 10a of the substrate 10 and the upper surface 10t2 of the second portion 10c2 of the connection member 10c is, for example, 80 nm or more and 130 nm or less. The distance d5 corresponds to a width W4 in the Z-direction of the connection member 10c located on the substrate 10.

Hereinafter, a method for manufacturing the semiconductor memory device according to the first embodiment will be described.

FIG. 3 to FIG. 12 are each a sectional view showing the method for manufacturing the semiconductor memory device according to the first embodiment, and each show a cross section corresponding to FIG. 2.

Figure 3:
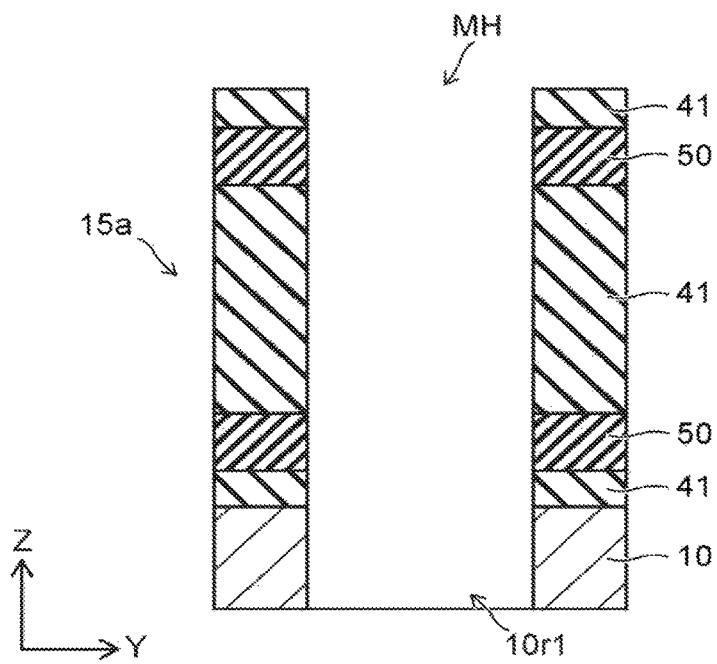
FIG. 3 to FIG. 12 are cross-sectional views showing a manufacturing method of the semiconductor memory device according to the first embodiment.

First, as shown in FIG. 3, an insulating layer 41 and a sacrifice layer 50 are alternately stacked along the Z-direction on a substrate 10 containing silicon by, for example, a CVD (Chemical Vapor Deposition) method, whereby a stacked body 15a is formed. The sacrifice layer 50 is formed of a material having an etching selection ratio with respect to the insulating layer 41, and is formed of, for example, silicon nitride.

Subsequently, a memory hole MH (through-hole) is formed in the stacked body 15a by, for example, a lithography method and an RIE (Reactive Ion Etching) method. The memory hole MH pierces the stacked body 15a to reach the substrate 10, and is made to penetrate into an upper layer portion of the substrate 10. By doing this, a concave portion 10r1 is formed in the substrate 10.

Figure 4:
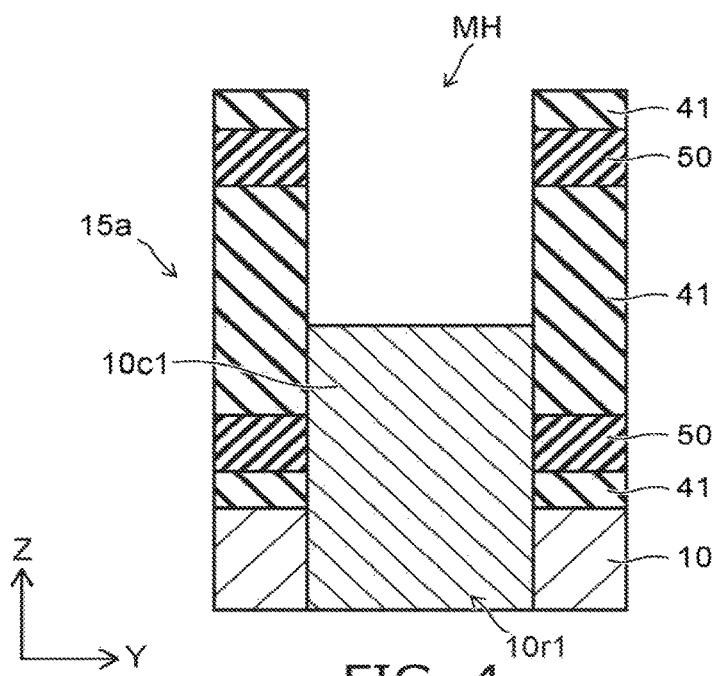

Subsequently, as shown in FIG. 4, silicon is epitaxially grown using an inner surface of the concave portion 10r1 of the substrate 10 as a starting point. For example, the substrate 10 is put in a reaction chamber, and a raw material gas such as a silicon compound is supplied into the reaction chamber, whereby a silicon member epitaxially grown to a desired thickness is formed. By doing this, a first portion 10c1 is formed in a lower portion in the memory hole MH. At this time, a lower part of the first portion 10c1 is located in the substrate 10, and an upper part of the first portion 10c1 is located in the stacked body 15a.

Figure 5:
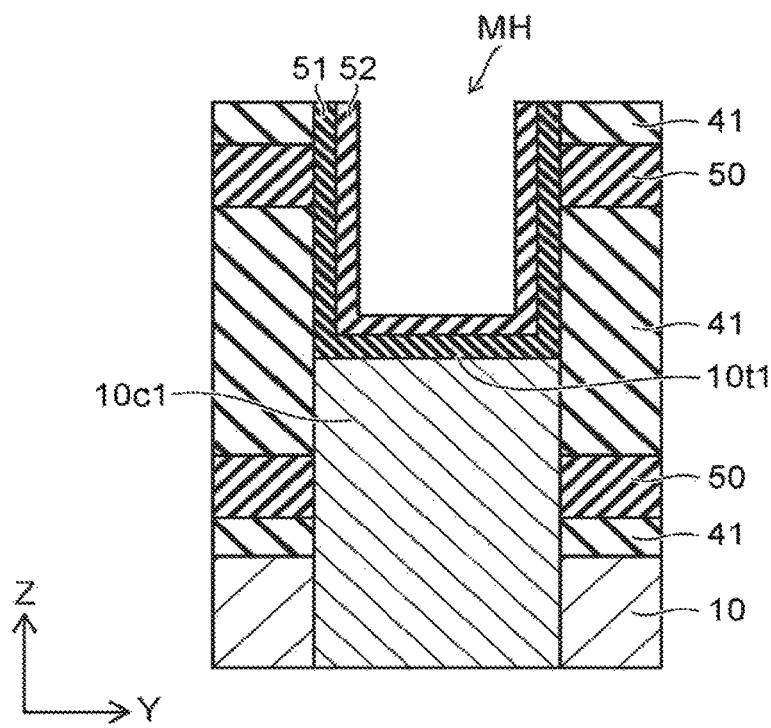

Subsequently, as shown in FIG. 5, an insulating film 51 is formed by depositing silicon oxide on an inner wall surface of the memory hole MH and on an upper surface 10t1 of the first portion 10c1 by, for example, a CVD method. Subsequently, a protective film 52 is formed by depositing silicon nitride on an inner surface of the insulating film 51.

Figure 6:
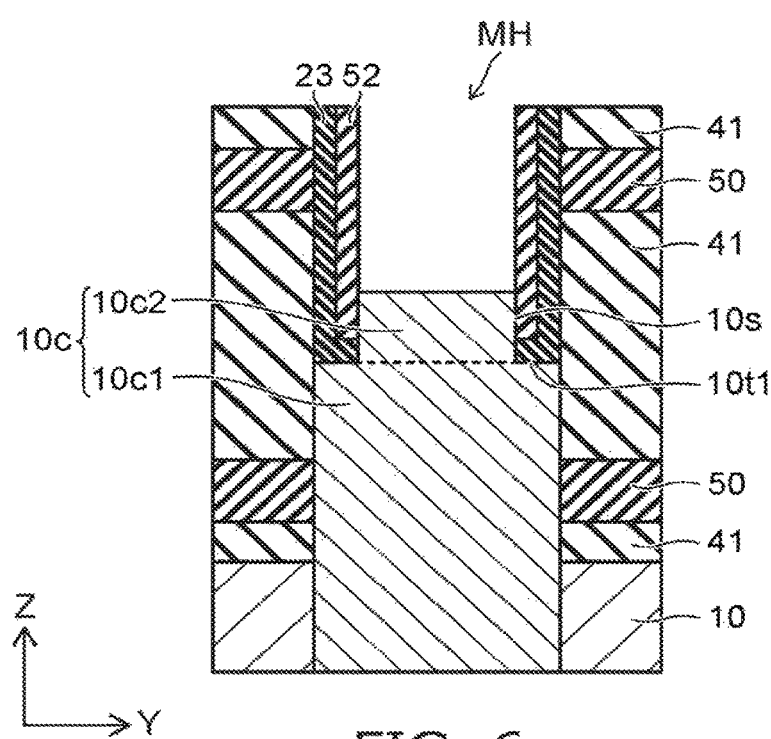

Subsequently, as shown in FIG. 6, the insulating film 51 and the protective film 52 are removed from the bottom surface by, for example, an RIE method, whereby the first portion 10c1 is exposed. By doing this, a block insulating film 23 is formed. The protective film 52 is formed on the inner surface of the insulating film 51, and therefore, removal of a side surface of the block insulating film 23 can be suppressed. For example, the block insulating film 23 is in contact with an upper surface 10t1 of the first portion 10c1.

Subsequently, silicon in the first portion 10c1 is epitaxially grown using the upper surface 10t1 of the first portion 10c1 as a starting point. For example, a silicon member epitaxially grown to a desired thickness is formed on the first portion 10c1 under the same conditions as the conditions for forming the first portion 10c1. By doing this, a second portion 10c2 is formed on the first portion 10c1. Further, in the memory hole MH, a connection member 10c including the first portion 10c1 and the second portion 10c2 is formed. For example, a side surface 10s of the second portion 10c2 is in contact with the block insulating film 23 and the protective film 52.

Figure 7:
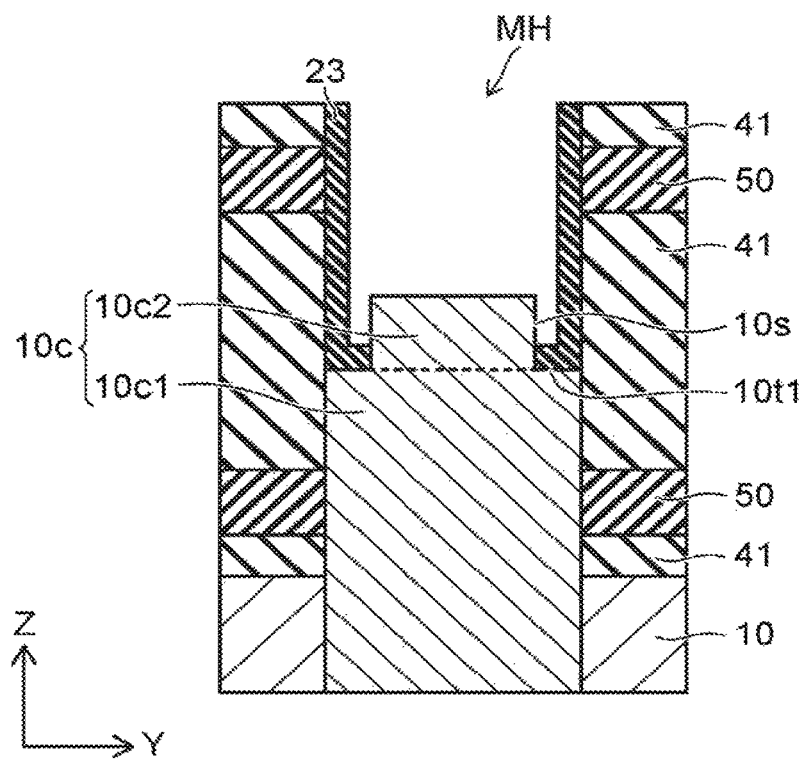

Subsequently, as shown in FIG. 7, the protective film 52 on the inner surface of the block insulating film 23 is removed by, for example, wet etching or chemical dry etching (CDE) using a gas.

Figure 8:
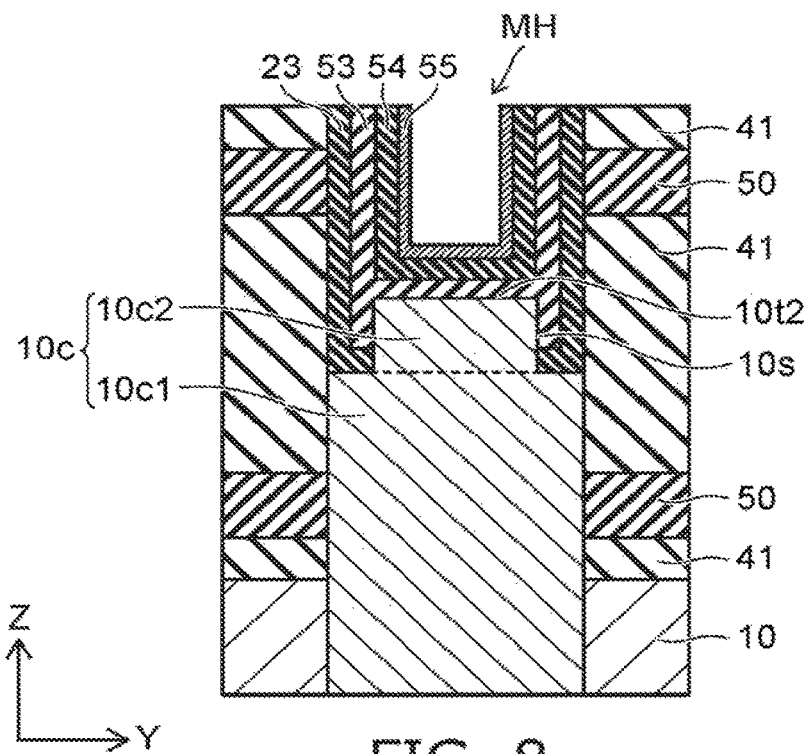

Subsequently, as shown in FIG. 8, a silicon nitride film 53 is formed on an inner surface of the block insulating film 23 (including on the side surface 10s of the second portion 10c2) and on the upper surface 10t2 of the second portion 10c2 by, for example, a CVD method. Thereafter, a silicon oxide film 54 is formed on an inner surface of the silicon nitride film 53, and a silicon layer 55 is formed on an inner surface of the silicon oxide film 54. The silicon layer 55 is formed of, for example, amorphous silicon.

Figure 9:
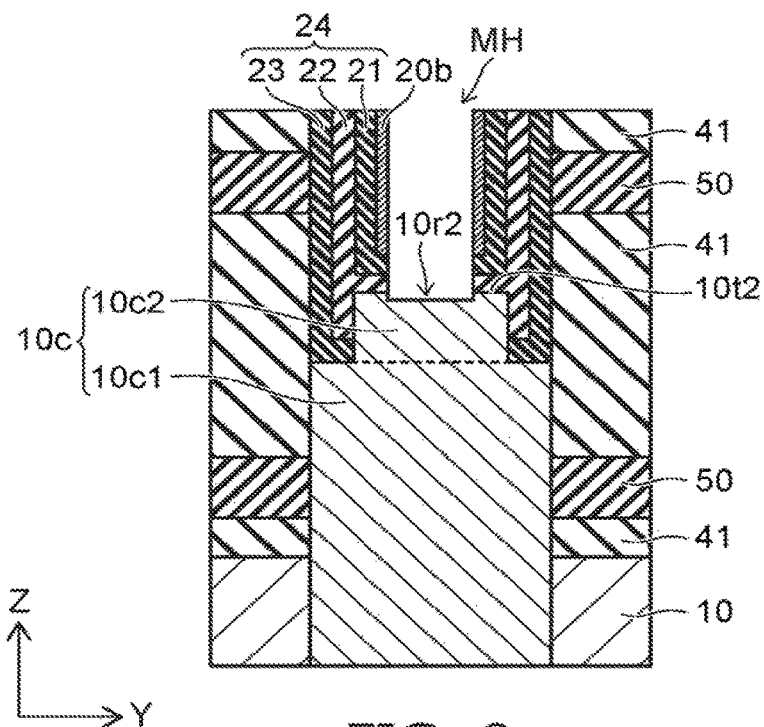

Subsequently, as shown in FIG. 9, the silicon nitride film 53, the silicon oxide film 54, and the silicon layer 55 are removed from the bottom surface by, for example, an RIE method, whereby the second portion 10c2 of the connection member 10c is exposed. By doing this, a charge storage film 22, a tunnel insulating film 21 (corresponding to the silicon oxide film 54), and a cover layer 20b are formed. Further, a memory film 24 including the tunnel insulating film 21, the charge storage film 22, and the block insulating film 23 is formed. For example, the charge storage film 22 is in contact with the upper surface 10t2 of the second portion 10c2. In an example shown in FIG. 9, the concave portion 10r2 is formed in the second portion 10c2 by etching, however, the concave portion 10r2 may not be formed.

Figure 10:
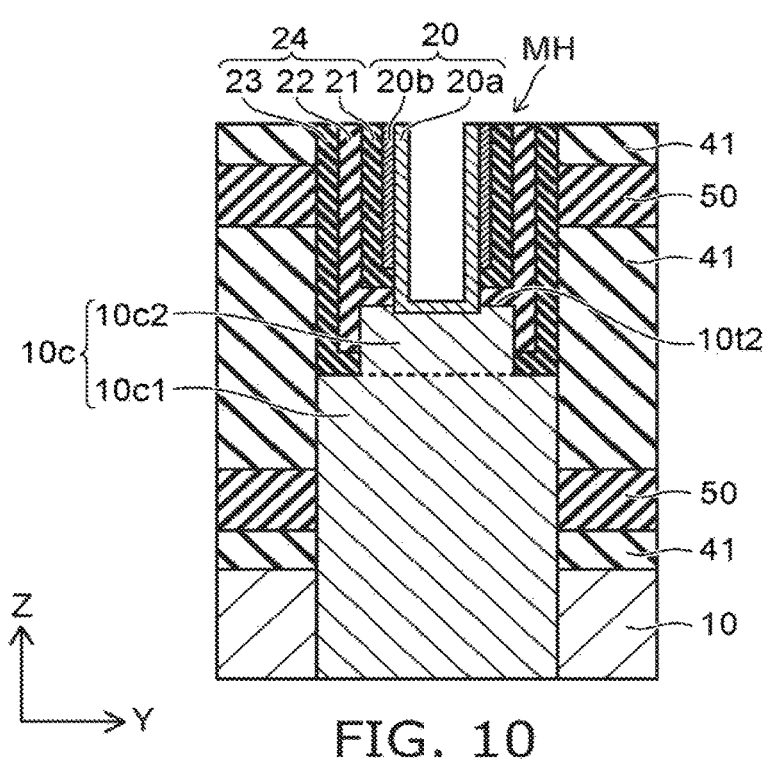

Subsequently, as shown in FIG. 10, silicon is deposited in the memory hole MH, and thereafter, silicon is crystallized by performing an annealing treatment. For example, amorphous silicon is crystallized, whereby polysilicon is formed. By doing this, a body 20a is formed. Further, a channel 20 including the body 20a, and the cover layer 20b is formed. The body 20a is in contact with the upper surface 10t2 of the second portion 10c2.

Figure 11:
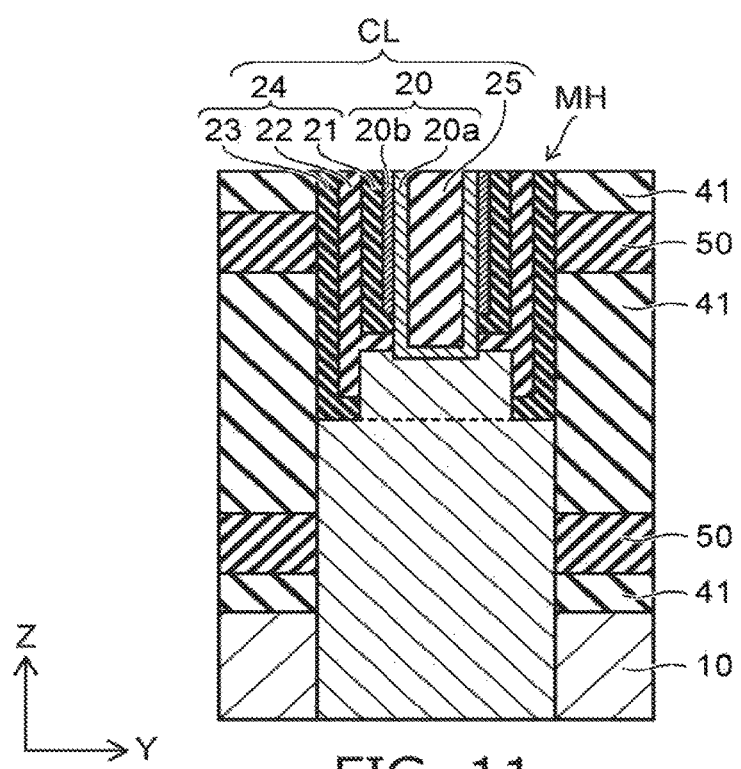

Subsequently, as shown in FIG. 11, a core portion 25 is formed by depositing silicon oxide on an inner surface of the body 20a. By doing this, a columnar portion CL including the core portion 25, the channel 20, and the memory film 24 is formed. Subsequently, a contact plug (not shown) is formed by depositing silicon on an upper end of the core portion 25. Thereafter, a plurality of slits ST (see FIG. 1) extending in the X-direction and Z-direction is formed in the stacked body 15a by, for example, anisotropic etching such as RIE.

Figure 12:
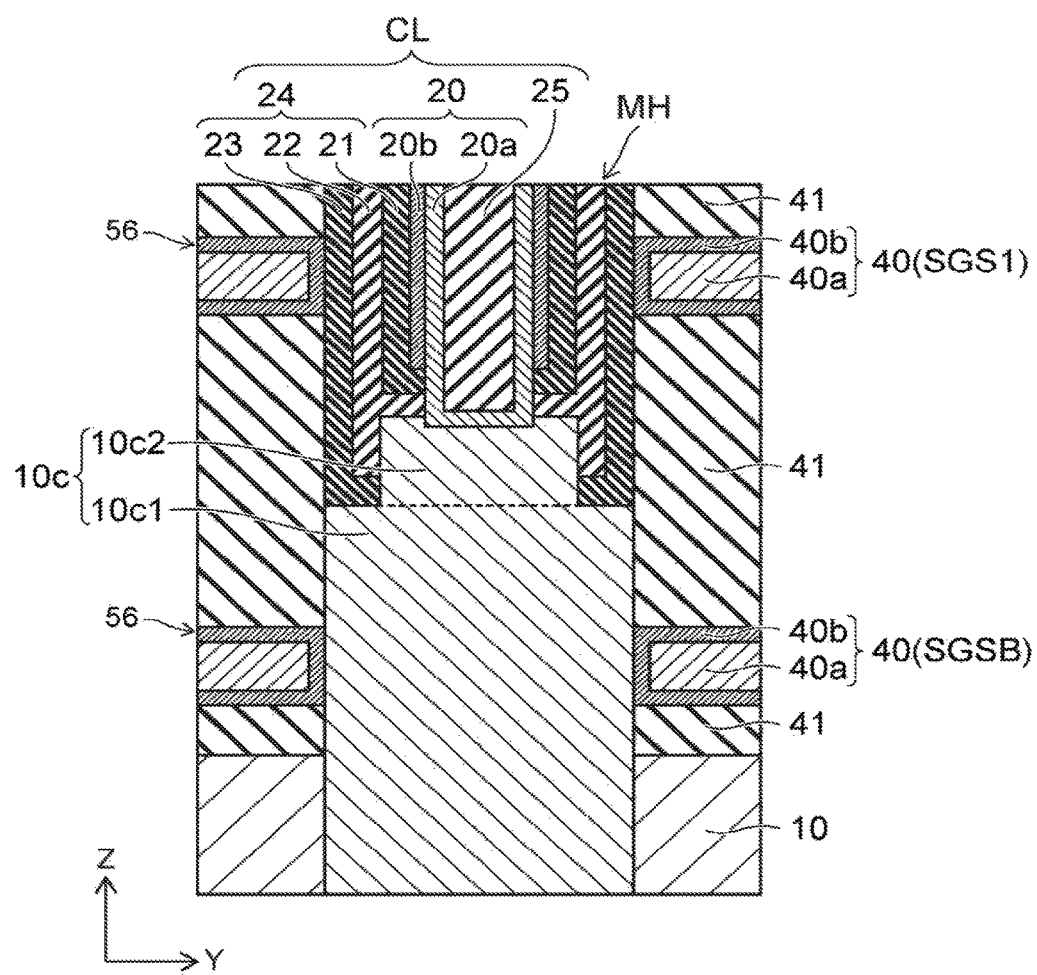

Subsequently, as shown in FIG. 12, by performing wet etching through the slit ST, the sacrifice layer 50 is removed. For example, in a case where the sacrifice layer 50 is formed of silicon nitride, phosphoric acid is used as an etchant for wet etching, and a treatment is performed by hot phosphoric acid. By removing the sacrifice layer 50 through the slit ST, a cavity 56 is formed.

Subsequently, by, for example, a CVD method, a peripheral portion 40b is formed by depositing titanium nitride, and a main body portion 40a is formed by depositing tungsten in the cavity 56. By doing this, an electrode layer 40 is formed in the cavity. Further, a stacked body 15 including a source-side selection gate SGS, a drain-side selection gate SGD, a plurality of word lines WL, and a plurality of insulating layers 41 is formed (see FIG. 1). Incidentally, as shown in FIG. 11, on a lower side of the stacked body 15, a source-side selection gate SGS including an upper layer source-side selection gate SGS1 and a lower layer source-side selection gate SGSB is formed.

Subsequently, an interconnect portion 18 (see FIG. 1) is formed in the slit ST. Thereafter, on the interconnect portion 18, a contact portion 31 and a source line SL are sequentially formed. On the other hand, on the columnar portion CL, a contact portion 30 and a bit line BL are sequentially formed.

In this manner, the semiconductor memory device 1 according to the first embodiment is manufactured.

Hereinafter, an effect of the first embodiment will be described.

Figure 13A:
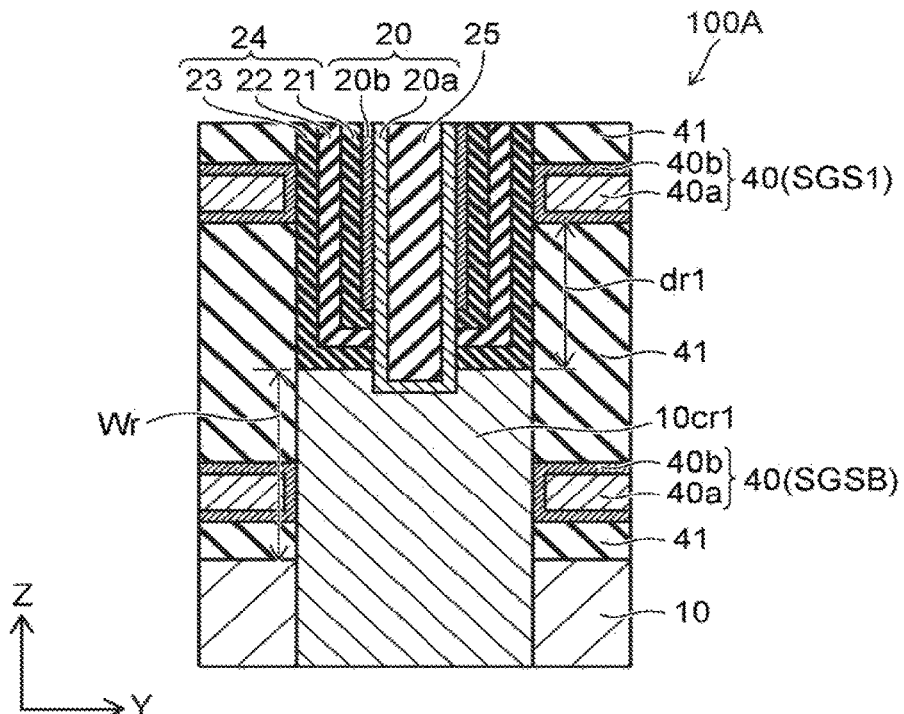
FIG. 13A and FIG. 13B are cross-sectional views showing a part of a semiconductor memory device according to a comparative example.
Figure 13B:
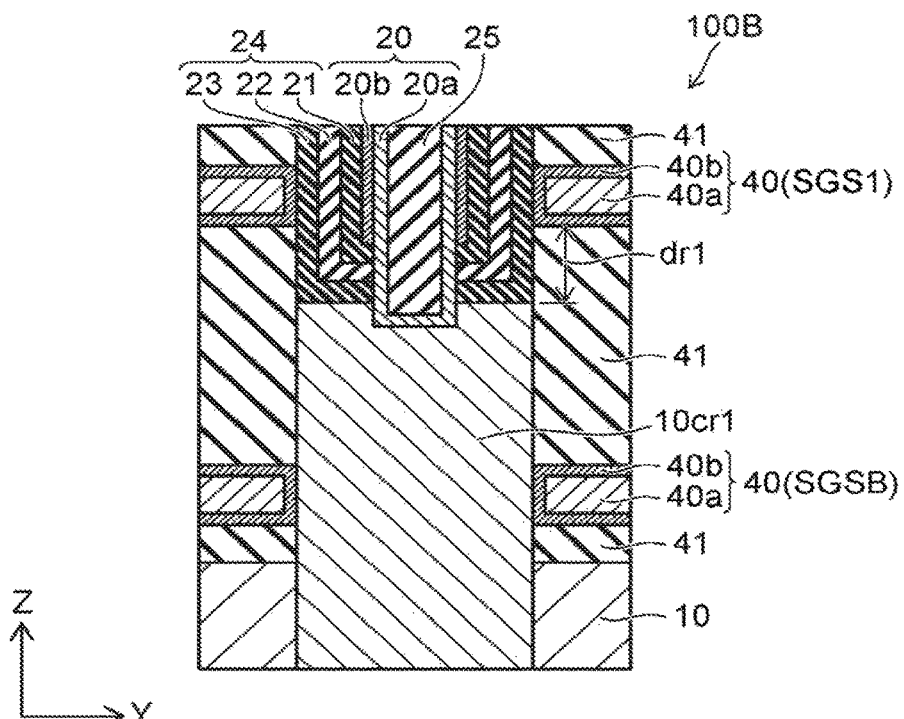

FIG. 13A and FIG. 13B are each a sectional view showing a semiconductor memory device according to a comparative example.

FIG. 13A and FIG. 13B each show a cross section corresponding to FIG. 2.

In the semiconductor memory device, a connection member is provided throughout a stacked body from a substrate in a memory hole, and a columnar portion including a channel and a memory film is provided on the connection member. In such a structure, as shown in FIG. 13A, when a distance dr1 in the Z-direction between an upper layer source-side selection gate SGS1 and a connection member 10cr1 is increased, a distance in the Z-direction between the upper layer source-side selection gate SGS1 and a body 20a of a channel 20 in contact with the connection member 10cr1 is increased. Further, between the upper layer source-side selection gate SGS1 and the lower layer source-side selection gate SGSB, a region to which an electric field (fringe electric field) from the upper layer source-side selection gate SGS1 is applied is formed. Therefore, when the distance between the upper layer source-side selection gate SGS1 and the body 20a is increased, the fringe electric field is decreased, and therefore, electrical coupling between the upper layer source-side selection gate SGS1 and the body 20a becomes weak. Due to this, in a source-side selection transistor STS in which the upper layer source-side selection gate SGS1 functions as a gate, an on-current is decreased, and therefore, the operation of the semiconductor memory device may not be stabilized.

Further, when the distance dr1 in the Z-direction between the upper layer source-side selection gate SGS1 and the connection member 10cr1 is increased, the distance in the Z-direction between the lower layer source-side selection gate SGSB and the connection member 10cr1 is decreased.

Therefore, a width Wr in the Z-direction of the connection member 10cr1 located on the substrate 10 is decreased. When the width Wr of the connection member 10cr1 is decreased, a breakdown voltage of the lower layer source-side selection gate SGSB may be affected in some cases.

On the other hand, as shown in FIG. 13B, when the distance dr1 in the Z-direction between the upper layer source-side selection gate SGS1 and the connection member 10cr1 is decreased, the upper layer source-side selection gate SGS1 comes closer to the connection member 10cr1. Therefore, a leakage current easily flows in the connection member 10cr1 from the upper layer source-side selection gate SGS1, and thus, the operation of the semiconductor memory device may not be stabilized.

The semiconductor memory device 1 of the embodiment includes the connection member 10c in which the second portion 10c2 is provided on the first portion 10c1. Further, the body 20a of the channel 20 is in contact with the upper surface 10t2 of the second portion 10c2, and on the side surface 10s of the second portion 10c2, the block insulating film 23 is provided.

Therefore, as compared with the semiconductor memory device 100A in FIG. 13A, the distance d3 in the Z-direction between the upper layer source-side selection gate SGS1 and the second portion 10c2 of the connection member 10c can be decreased, and thus, the distance between the upper layer source-side selection gate SGS1 and the body 20a of the channel 20 in contact with the connection member 10c can be decreased. For example, the distance d3 shown in FIG. 2 is 35 nm, and the distance dr1 shown in FIG. 13A is 55 nm. According to this, the distance between the upper layer source-side selection gate SGS1 and the body 20a becomes small, and electrical coupling between the upper layer source-side selection gate SGS1 and the body 20a becomes strong. An on-current in the source-side selection transistor STS is increased, and therefore, the operation of the semiconductor memory device is stabilized.

Further, as compared with the semiconductor memory device 100A in FIG. 13A, the width W4 (distance d5) in the Z-direction of the connection member 10c located on the substrate 10 can be increased. For example, the width W4 shown in FIG. 2 is 80 nm, and the width Wr shown in FIG. 13A is 60 nm. According to this, the effect of the lower layer source-side selection gate SGSB on the breakdown voltage is suppressed.

Then, as compared with the semiconductor memory device 100B in FIG. 13B, the distance d2 in the Z-direction between the upper layer source-side selection gate SGS1 and the first portion 10c1 of the connection member 10c can be increased. For example, the distance d2 shown in FIG. 2 is 55 nm, and the distance dr1 shown in FIG. 13B is 35 nm. Therefore, by ensuring the distance between the upper layer source-side selection gate SGS1 and the first portion 10c1, the flow of a leakage current in the first portion 10c1 of the connection member 10c from the upper layer source-side selection gate SGS1 is suppressed. Further, since the block insulating film 23 is provided on the side surface 10s of the second portion 10c2, the flow of a leakage current in the second portion 10c2 of the connection member 10c from the upper layer source-side selection gate SGS1 is suppressed. According to this, the operation of the semiconductor memory device is stabilized.

According to the embodiment described above, a semiconductor memory device having improved operational stability can be realized.

Second Embodiment

Figure 14:
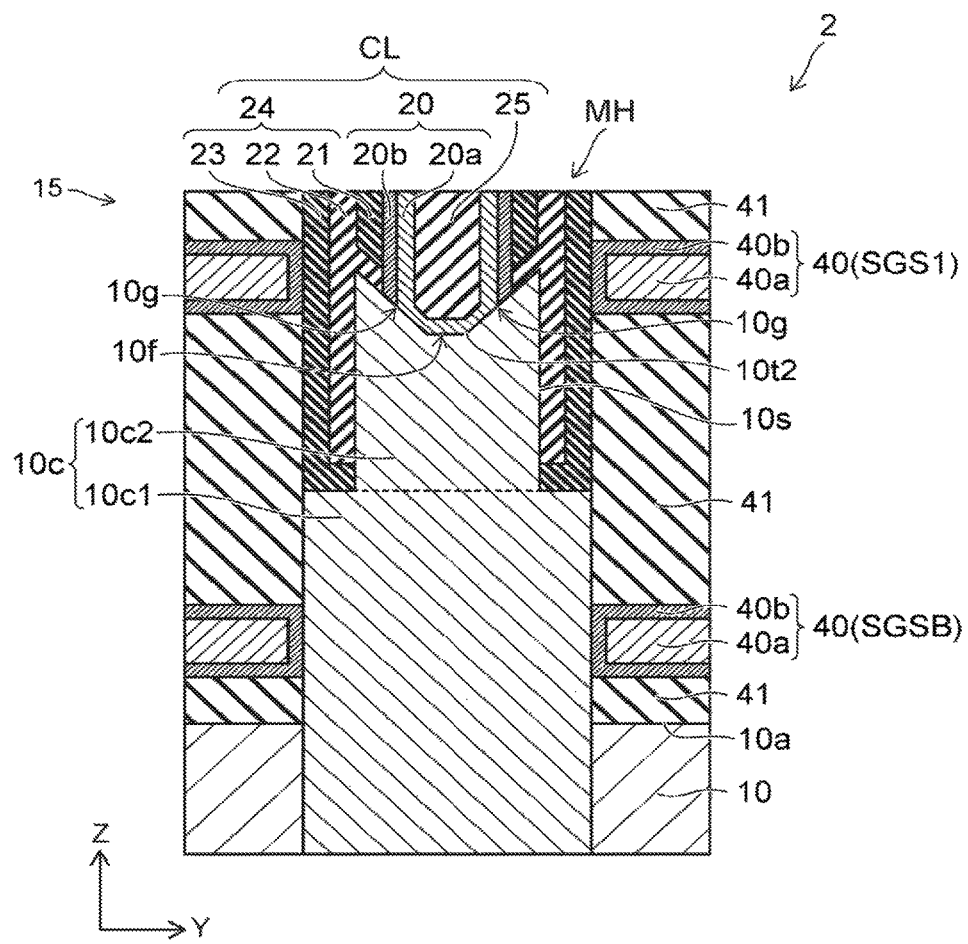
FIG. 14 is a cross-sectional view showing a part of a semiconductor memory device according to a second embodiment.

FIG. 14 shows a lower part of a stacked body 15 in the vicinity of a columnar portion CL in an enlarged manner.

FIG. 14 shows a cross section corresponding to FIG. 2.

The embodiment and the first embodiment are different in the shape of the second portion 10c2 of the connection member 10c. A configuration other than the shape of the second portion 10c2 is the same as that of the first embodiment, and therefore, a detailed description of the other configuration is omitted.

As shown in FIG. 14, a connection member 10c is provided over an inner portion of the stacked body 15 from an inner portion of a substrate 10 in a memory hole MH. The connection member 10c includes a first portion 10c1 and a second portion 10c2. The second portion 10c2 is located in the stacked body 15.

An upper surface 10t2 of the second portion 10c2 includes a plane portion 10f and an inclined portion 10g. The plane portion 10f is substantially parallel to an upper surface 10a of the substrate 10, that is, an X-Y plane. The inclined portion 10g is low on an inner side and high on an outer side, and is displaced upward, that is, on a side of the columnar portion CL toward the outer side. The inclined portion 10g surrounds the plane portion 10f, and by the inclined portion 10g and the plane portion 10f, a concave portion is formed in the second portion 10c2.

On the plane portion 10f, a body 20a of a channel 20 is provided. On the inclined portion 10g, a charge storage film 22 and the channel 20 are provided. The plane portion 10f and the inclined portion 10g are in contact with the body 20a of the channel 20.

On a side surface 10s of the second portion 10c2, the charge storage film 22 and a block insulating film 23 are provided.

Hereinafter, an effect of the second embodiment will be described.

Figure 15A:
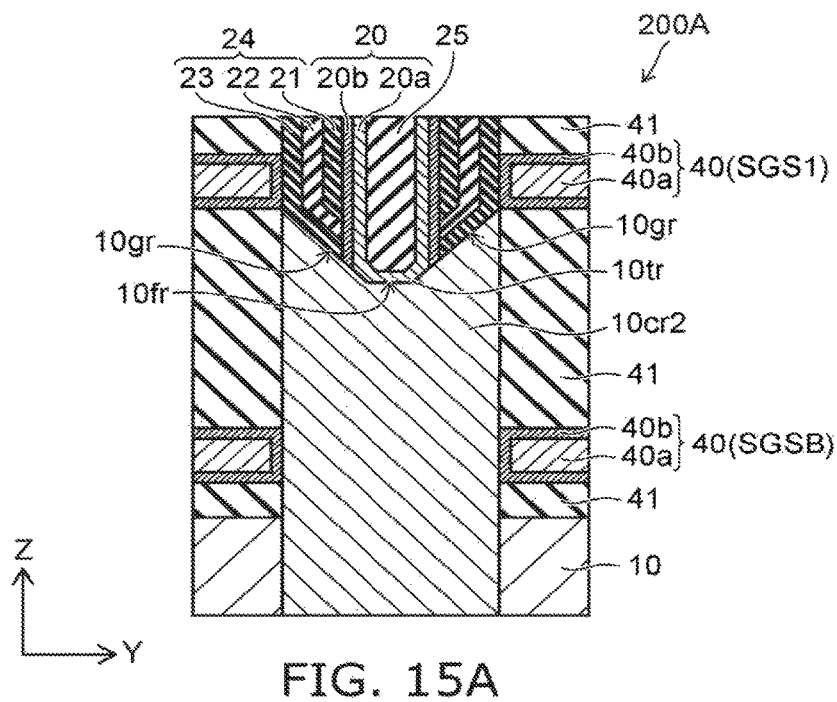
FIG. 15A and FIG. 15B are cross-sectional views showing a part of a semiconductor memory device according to a comparative example.
Figure 15B:
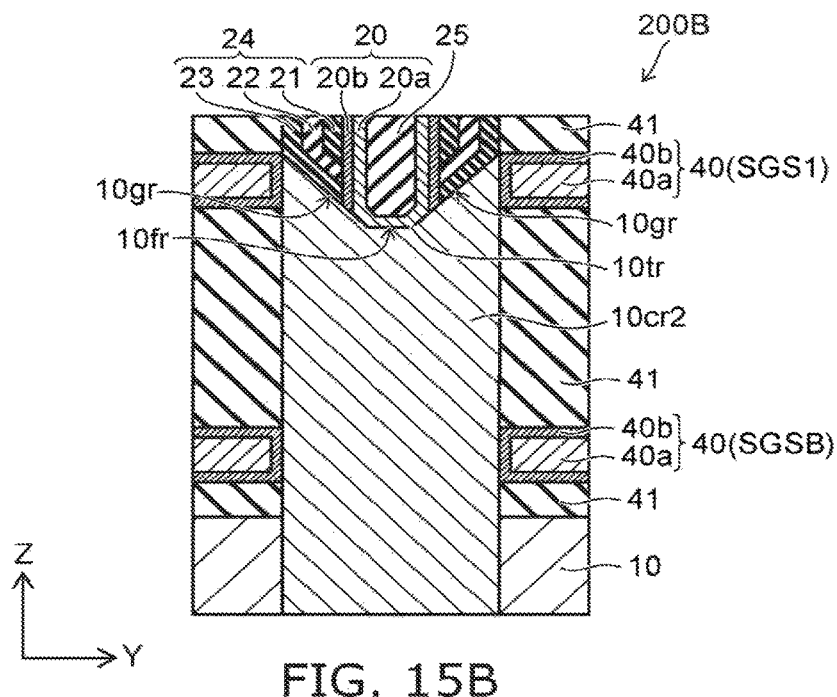

FIG. 15A and FIG. 15B are each a sectional view showing a part of a semiconductor memory device according to a comparative example.

FIG. 15A and FIG. 15B each show a cross section corresponding to FIG. 14.

A semiconductor memory device 2 of this embodiment includes the connection member 10c in which the second portion 10c2 is provided on the first portion 10c1. Further, the body 20a of the channel 20 is in contact with the plane portion 10f and the inclined portion 10g of the upper surface 10t2 of the second portion 10c2, and on the side surface 10s of the second portion 10c2, the block insulating film 23 is provided.

As shown in FIG. 14, in the semiconductor memory device 2 of this embodiment, the upper surface 10t2 of the second portion 10c2 includes the plane portion 10f and the inclined portion 10g. On the other hand, as shown in FIG. 15A and FIG. 15B, in semiconductor memory devices 200A and 200B of comparative examples, an upper surface 10tr of a connection member 10cr2 includes a plane portion 10fr and an inclined portion 10gr. That is, in any of the semiconductor memory device 2 and the semiconductor memory devices 200A and 200B, the plane portion and the inclined portion are formed in the upper surface of the connection member.

In the semiconductor memory device 2 of this embodiment, the distance between the upper layer source-side selection gate SGS1 and the body 20a of the channel 20 in contact with the connection member 10c can be decreased as compared with the semiconductor memory device 200A in FIG. 15A. According to this, the distance between the upper layer source-side selection gate SGS1 and the body 20a becomes small, and electrical coupling between the upper layer source-side selection gate SGS1 and the body 20a becomes strong. An on-current in the source-side selection transistor STS is increased, and therefore, the operation of the semiconductor memory device is stabilized.

In the semiconductor memory device 2 of this embodiment, the distance between the upper layer source-side selection gate SGS1 and the first portion 10c1 of the connection member 10c can be increased as compared with the semiconductor memory device 200B in FIG. 15B. Therefore, by ensuring the distance between the upper layer source-side selection gate SGS1 and the first portion 10c1, the flow of a leakage current in the first portion 10c1 of the connection member 10c from the upper layer source-side selection gate SGS1 is suppressed. Further, since the block insulating film 23 is provided on the side surface 10s of the second portion 10c2, the flow of a leakage current in the second portion 10c2 of the connection member 10c from the upper layer source-side selection gate SGS1 is suppressed. According to this, the operation of the semiconductor memory device is stabilized.

According to the embodiment described above, a semiconductor memory device having improved operational stability can be realized.

Third Embodiment

Figure 16:
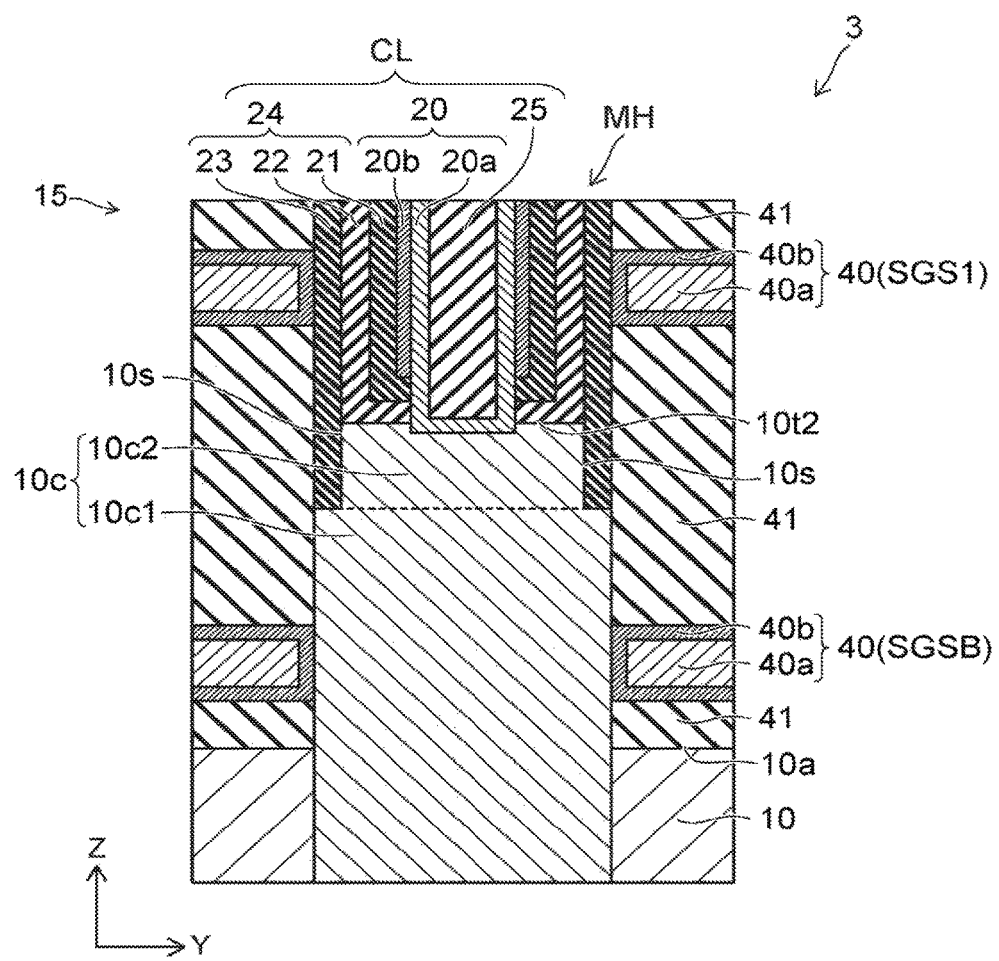
FIG. 16 is a cross-sectional view showing a part of a semiconductor memory device according to a third embodiment.

FIG. 16 shows a lower part of a stacked body 15 in the vicinity of a columnar portion CL in an enlarged manner.

FIG. 16 shows a cross section corresponding to FIG. 2.

The embodiment and the first embodiment are different in the formation position of the charge storage film 22. A configuration other than the formation position of the charge storage film 22 is the same as that of the first embodiment, and therefore, a detailed description of the other configuration is omitted.

As shown in FIG. 16, on an upper surface 10t2 of a second portion 10c2 of a connection member 10c, a charge storage film 22 and a body 20a of a channel 20 are provided. On a side surface 10s of the second portion 10c2 of the connection member 10c, a block insulating film 23 is provided. That is, in the embodiment, on the side surface 10s of the second portion 10c2, a charge storage film 22 is not provided.

Hereinafter, an effect of the third embodiment will be described.

In a semiconductor memory device 3 of the embodiment, the charge storage film 22 is provided on the upper surface 10t2 of the second portion 10c2 of the connection member 10c, and is not provided on the side surface 10s. According to this, in a method for manufacturing the semiconductor memory device 3, a process for forming a protective film 52 as shown in FIG. 5 can be omitted, and therefore, the number of manufacturing processes can be reduced.

To be more specific, since the protective film 52 is not formed in the process in FIG. 5, the block insulating film 23 is formed on the side surface 10s of the second portion 10c2 in the process in FIG. 6. Further, in the process in FIG. 8, a silicon nitride film 53 is formed on the upper surface 10t2 of the second portion 10c2, but is not formed on the side surface 10s. Therefore, the charge storage film 22 is formed on the upper surface 10t2 of the second portion 10c2.

An effect of the embodiment other than the above-mentioned effect is the same as that of the above-mentioned first embodiment.

Fourth Embodiment

Figure 17:
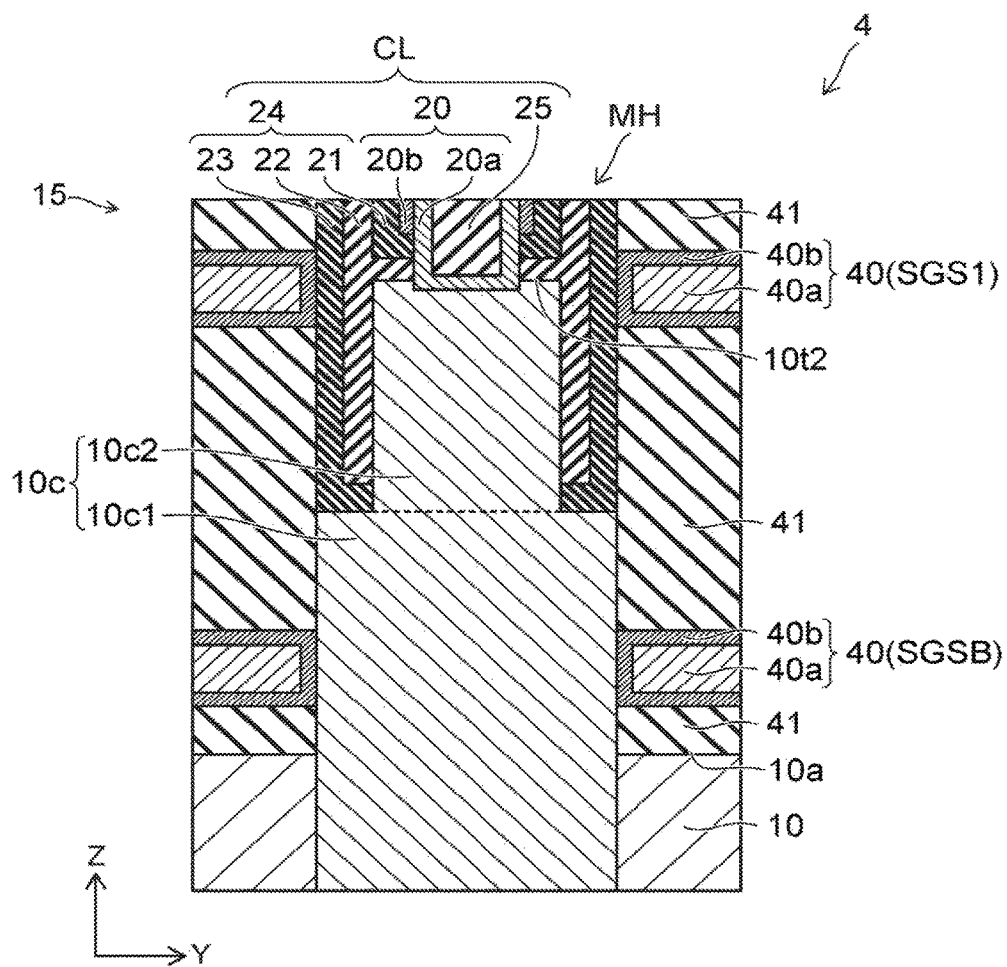
FIG. 17 and FIG. 18 are cross-sectional views showing a part of a semiconductor memory device according to a fourth embodiment.
Figure 18:
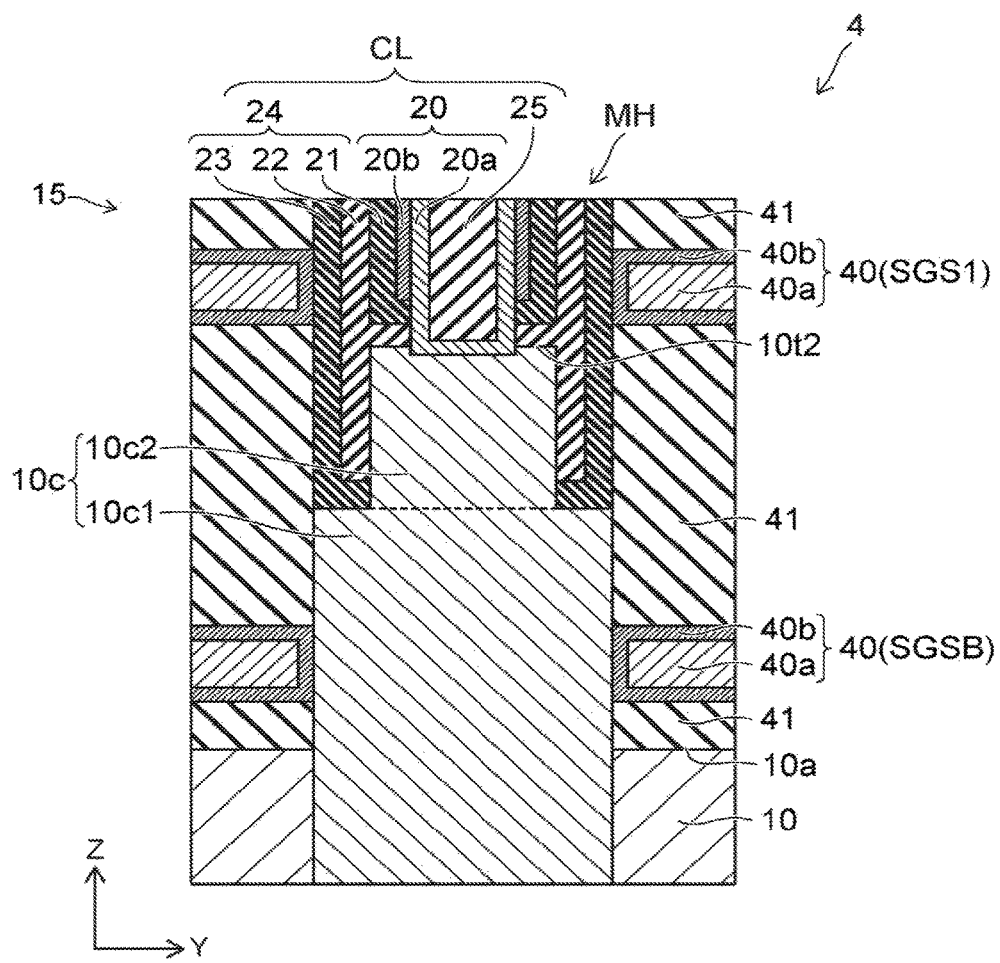

FIG. 17 and FIG. 18 each show a lower part of a stacked body 15 in the vicinity of a columnar portion CL in an enlarged manner.

FIG. 17 and FIG. 18 each show a cross section corresponding to FIG. 2.

In a semiconductor memory device 4 of the embodiment, an upper part of the second portion 10c2 of the connection member 10c of the second embodiment as shown in FIG. 14 is formed to have a flat structure. In such a case, as shown in FIG. 17, for example, a position in the Z-direction of an upper surface 10t2 of a second portion 10c2 is substantially the same as the position in the Z-direction of an end on an outside of the inclined portion 10g in FIG. 14. Further, in the Z-direction, the upper surface 10t2 of the second portion 10c2 is located in the upper layer source-side selection gate SGS1.

As shown in FIG. 18, the position in the Z-direction of the upper surface 10t2 of the second portion 10c2 may be substantially the same as the position in the Z-direction of the plane portion 10f in FIG. 14.

Incidentally, an effect of the embodiment is the same as that of the above-mentioned first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a semiconductor substrate;
   a stacked body provided on the semiconductor substrate and including a plurality of electrode layers separately stacked each other;
   a semiconductor member provided in the semiconductor substrate and in the stacked body, extending in a stacking direction of the plurality of electrode layers, and including a first portion and a second portion, the first portion being in contact with the semiconductor substrate, the second portion being provided on the first portion, being in contact with the first portion, and having a second width smaller than a first width of the first portion in a first direction crossing the stacking direction;
   a semiconductor portion provided in the stacked body, extending in the stacking direction, and being in contact with an upper surface of the second portion;
   a first insulating film provided on a side surface of the second portion; and
   a charge storage film provided on a side surface of the semiconductor portion, extending in the stacking direction, and including a first portion located on an upper surface of the second portion of the semiconductor member.

2. The device according to claim 1, wherein the charge storage film includes a second portion located on a side surface of the second portion of the semiconductor member.

3. The device according to claim 2, wherein the charge storage film is in contact with the second portion of the semiconductor member.

4. The device according to claim 1, wherein the charge storage film is not disposed in the electrode layer which is a lowest layer in the plurality of electrode layers.

5. The device according to claim 1, wherein the first insulating film extends in the stacking direction to surround the semiconductor portion, and is located on an upper surface of the first portion of the semiconductor member.

6. The device according to claim 5, wherein the charge storage film is located between the second portion of the semiconductor member and the first insulating film and between the semiconductor portion and the first insulating film.

7. The device according to claim 1, wherein in the stacking direction, the second portion is located on an upper side of the electrode layer which is a lowest layer in the plurality of electrode layers.

8. The device according to claim 1, wherein in the stacking direction, the second portion is located between the electrode layer which is a lowest layer and the electrode layer which is a second lowest layer in the plurality of electrode layers.

9. The device according to claim 8, wherein a distance in the stacking direction between the second portion and the electrode layer which is the second lowest layer is not more than a width in the stacking direction of a word line or not more than a width in the stacking direction of a selection gate.

10. The device according to claim 1, wherein in the stacking direction, an upper surface of the second portion is located in the electrode layer which is a second lowest layer in the plurality of electrode layers.

11. The device according to claim 1, wherein
an upper surface of the second portion includes a plane portion and an inclined portion, the plane portion being substantially parallel to an upper surface of the semiconductor substrate, the inclined portion surrounding the plane portion and being inclined with respect to the upper surface of the semiconductor substrate, and
the semiconductor portion is in contact with the plane portion and the inclined portion.

12. The device according to claim 11, wherein the charge storage film is located on the inclined portion and a side surface of the second portion.

13. The device according to claim 1, wherein
a crystal structure of the semiconductor substrate and a crystal structure of the first portion of the semiconductor member are continuous with each other, and
a crystal structure of the first portion of the semiconductor member and a crystal structure of the second portion are continuous with each other.

14. The device according to claim 1, further comprising:
a second insulating film provided around the semiconductor portion,
wherein the semiconductor portion includes a body and a cover layer provided around the body,
the first insulating film extends in the stacking direction to surround the charge storage film, and is located on an upper surface of the first portion of the semiconductor member,
the charge storage film is located on a side surface of the second portion of the semiconductor member, and
the body is in contact with an upper surface of the second portion of the semiconductor member.

15. A method for manufacturing a semiconductor memory device, comprising:
forming a stacked body by alternately stacking a first insulating layer and a first layer on a silicon substrate;
forming a through-hole extending in a stacking direction of the stacked body to pierce the stacked body and form a concave portion in the silicon substrate;
forming a first portion in a lower part of the through-hole by epitaxially growing silicon using an inner surface of the concave portion of the silicon substrate as a starting point;
forming a first insulating film on an inner wall surface of the through-hole and on an upper surface of the first portion;
removing a part of the first insulating film on the upper surface of the first portion;
forming a second portion on the first portion by epitaxially growing silicon using the upper surface of the first portion exposed by removing the part of the first insulating film as a starting point; and
forming a semiconductor portion by depositing silicon on the second portion.

16. The method according to claim 15, further comprising:
forming a protective film on an inner surface of the first insulating film after forming the first insulating film; and
removing a portion disposed on a part of the upper surface of the first portion in the protective film.

17. The method according to claim 16, further comprising:
removing a residual portion of the protective film; and
forming a charge storage film on the inner surface of the first insulating film and on an upper surface of the second portion.

18. The method according to claim 17, wherein the charge storage film is in contact with the second portion.

19. The method according to claim 15, further comprising:
forming a slit extending in the stacking direction and a first direction crossing the stacking direction, in the stacked body;
removing the first layer through the slit; and
forming an electrode layer in a cavity obtained by removing the first film through the slit.

* * * * *